(12) United States Patent
Haraguchi et al.

(10) Patent No.: US 6,285,622 B1
(45) Date of Patent: Sep. 4, 2001

(54) SEMICONDUCTOR DEVICE

(75) Inventors: Masaru Haraguchi; Kyoji Yamasaki, both of Tokyo; Yoshito Nakaoka, Hyogo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/698,036

(22) Filed: Oct. 30, 2000

(30) Foreign Application Priority Data

Oct. 29, 1999 (JP) .................................................. 11-308189

(51) Int. Cl.$^7$ ....................................................... G11C 7/00
(52) U.S. Cl. ............... 365/226; 365/189.11; 365/189.09; 365/189.07; 327/536; 327/537
(58) Field of Search ................................. 365/226, 189.11, 365/189.09, 189.07, 204; 327/536, 537

(56) References Cited

U.S. PATENT DOCUMENTS

| | | |
|---|---|---|
| 4,633,192 | 12/1986 | Anami . |
| 5,841,725 | * 11/1998 | Kang et al. ........................... 365/226 |
| 5,877,651 | 3/1999 | Furutani . |

FOREIGN PATENT DOCUMENTS

402166698 * 6/1990 (JP) ............................... G11C/16/06

* cited by examiner

*Primary Examiner*—David Nelms
*Assistant Examiner*—David Lam
(74) *Attorney, Agent, or Firm*—Oblon, Spivak, McClelland, Maier & Neustadt, P.C.

(57) ABSTRACT

In a circuit in which a step-up potential is generated by a charge pump, a through current passing through a buffer circuit (161*bb*) when an activation signal (ACTL) is at its low level, can be reduced by arranging so that a detector (161*ca*) is ahead of another detector (161*ba*) in detecting a decrease in step-up potential $V_{PP}$.

14 Claims, 11 Drawing Sheets

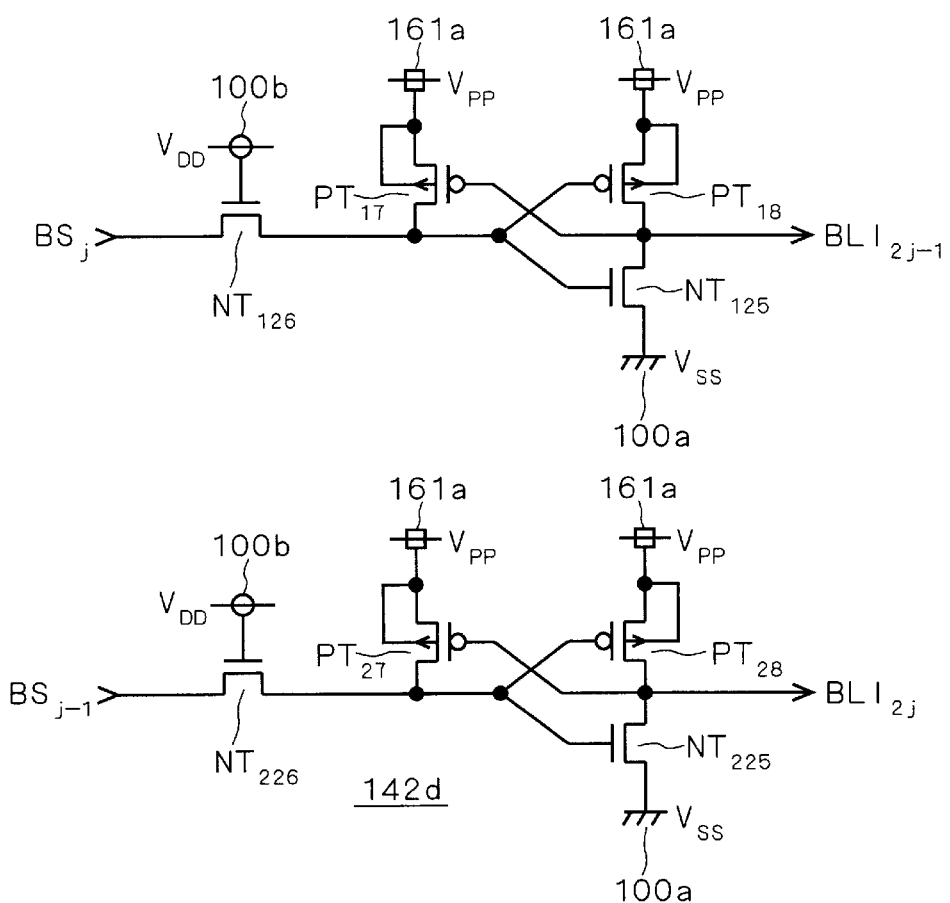
F I G. 8

SEMICONDUCTOR DEVICE

BACKGROUND OF THE INVENTION

1. Field of the Invention

The present invention relates to a semiconductor device and, in particular, to a semiconductor device having a circuit which generates an internal potential by a charge pump.

2. Description of the Background Art

Recently, semiconductor devices in which a large number of transistors are integrated are used in various electrical equipment, such as workstations and personal computers. Of these semiconductor devices, a DRAM is used as a main memory of personal computers. This DRAM has a charge pump for stetting up power-supply potential. FIG. 11 is a block diagram of a boost circuit contained in a conventional DRAM.

Referring to FIG. 11, the DRAM has a boost circuit 1 normally operating, and a boost circuit 2 that operates when the DRAM is active. Step-up potential $V_{PP}$ is outputted by the boost circuits 1 and 2. The boost circuit 1 includes a detecting circuit 3 that compares and amplifies reference potential $V_{REF}$ and input potential $V_{IN}$. The input potential $V_{IN}$ obeys the step-up potential $V_{PP}$. The boost circuit 1 further includes a buffering circuit for buffering the output of the detecting circuit 3, a clock generating circuit 5 that outputs a clock signal in response to the output of the buffering circuit 4, and a charge pump 6 driven by the output of the clock generating circuit 5. The charge pump 6 has a low capability of supplying step-up potential $V_{PP}$, but has a low power consumption.

The boost circuit 2 comprises a detecting circuit 7 that compares and amplifies reference potential $V_{REF}$ and input potential $V_{IN}$, a buffering circuit 8 for buffering the output of the detecting circuit 7, and an AND gate 9 that receives the output of the buffering circuit 8 and signal ACTL indicating the activation of the DRAM. The signal ACTL reaches its high level when the DRAM is active. The boost circuit 2 further comprises a clock generating circuit 10 that outputs a clock signal in response to the output of the AND gate 9, and a charge pump 11 driven by the output of the clock generating circuit 10. The charge pump 11 has a higher capability of supplying step-up potential $V_{PP}$ than the charge pump 6.

When the signal ACTL is at its low level indicating the inactive state, from the output of the AND gate 9, a low level is outputted regardless of the detection result of the detecting circuit 7. In response to this low level output, the clock generating circuit 10 stops oscillation of a clock signal. Then, the boost circuit 2 stops step-up operation, and only the boost circuit 1 executes step-up operation.

It is designed so that the detecting circuits 3 and 7 have the same detecting level. However, because of change in process, the detecting circuit 7 can be ahead of the detecting circuit 3 in detecting a decrease in step-up potential $V_{PP}$. Such a circuit has caused the following problems. That is, when signal ACTL is at its low level indicating the inactive state, the detecting circuit 7 detects a decrease in step-up potential $V_{PP}$ whereas the detecting circuit 3 does not detect it in some cases. In this case, both clock generating circuits 5 and 10 stop a clock signal oscillation, and both boost circuits 1 and 2 stop step-up operation. As a result, the output node of the detecting circuit 7 becomes an intermediate potential, and a through current passing through the subsequent buffering circuit 8.

SUMMARY OF THE INVENTION

According to a first aspect of the invention, a semiconductor device comprises: a first internal potential generating circuit including: a first detector for detecting a deviation from a predetermined level of an internal potential, a buffer circuit for receiving the output of the first detector, a control circuit for supplying a clock enable signal which becomes disable regardless of the output of the buffer circuit when an activation signal indicates the inactive state, and which is responsive to the output of the buffer circuit when the activation signal indicates the active state, a first oscillator that oscillates a first clock signal in response to the clock enable signal, and a first charge pump that generates the internal potential at an output node, according to the first clock signal; and a second internal potential for generating circuit including: a second detector that is ahead of the first detector in detecting a deviation from the predetermined level of the internal potential, a second oscillator that oscillates a second clock signal in response to the output of the second detector, and a second charge pump that generates the internal potential at the output node, according to the second clock signal.

According to a second aspect, the semiconductor device of the first aspect is characterized in that the second charge pump has a smaller capability of supplying the internal potential than the first charge pump.

According to a third aspect, the semiconductor device of the first aspect is characterized in that the second internal potential generating circuit further includes a buffer circuit for receiving the output of the second detector and supplying a clock enable signal to the second oscillator.

According to a fourth aspect, the semiconductor device of the first aspect is characterized in that the second detector detects a deviation from the predetermined level of the internal potential, based on the result of a comparison of a reference potential with an internal potential related potential related to the internal potential.

According to a fifth aspect, the semiconductor device of the fourth aspect further comprises: a level shifter for performing level shifting of the internal potential to supply a shift potential, the internal potential related potential includes the shift potential, characterized in that the second detector includes a current mirror circuit, and first and second transistors which are connected to the current mirror circuit and receive at their respective gates the shift potential and the reference potential, the first and second transistors have different current drive capabilities.

According to a sixth aspect, the semiconductor device of the fifth aspect is characterized in that the first and second transistors are of a first conductivity type, the current mirror circuit includes a third transistor of a second conductivity type having a drain and gate connected to the drain of the first transistor in common, and a fourth transistor of the second conductivity type having a drain connected to the drain of the second transistor, and having a gate connected to the gate of the third transistor; the second transistor has a greater channel width than the first transistor; and the output of the second detector is supplied from between the drains of the second and fourth transistors.

According to a seventh aspect, the semiconductor device of the first aspect is characterized in that the first detector detects a deviation from the predetermined level of the internal potential, based on the result of a comparison of a reference potential with an internal potential related potential related to the internal potential; and the second detector detects a deviation from the predetermined level of the internal potential, based on the result of a comparison of the reference potential with the internal potential related potential.

According to an eighth aspect, the semiconductor device of the seventh aspect further comprises: a level shifter for performing level shifting of the internal potential to supply a shift potential, the internal potential related potential including the shift potential, characterized in that the first detector includes a first current mirror circuit, and first and second transistors which are connected to the first current mirror circuit and receive at their respective gates the shift potential and the reference potential; the second detector includes a second current mirror circuit, and third and fourth transistors which are connected to the second current minor circuit and receive at their respective gates the shift potential and the reference potential; and the ratio of current drive capability of the first transistor to the second transistor is different from the ratio of current drive capability of the third transistor to the fourth transistor.

According to a ninth aspect, the semiconductor device of the eighth aspect is characterized in that the first to fourth transistors are of a first conductivity type; the first current mirror circuit includes a fifth transistor of a second conductivity type having a drain and gate connected to the drain of the fir transistor in common, and a sixth transistor of the second conductivity type having a drain connected to the drain of the second transistor and having a gate connected to the gate of the fifth transistor, the output of the first detector is supplied from between the drains of the second and sixth transistors; the second current mirror circuit includes a seventh transistor of the second conductivity type having a drain and gate connected to the drain of the third transistor, and an eighth transistor of the second conductivity type having a drain connected to the drain of the fourth transistor and having a gate connected to the gate of the seventh transistor; the output of the second detector is supplied from between the drains of the fourth and eighth transistors; and the ratio of channel width of the third transistor to the fourth transistor is larger than the ratio of channel width of the first transistor to the second transistor.

According to a tenth aspect, the semiconductor device of the first aspect is characterized in that the first detector detects a deviation from the predetermined level of the internal potential, based on the result of a comparison of a first reference potential with an internal potential related potential related to the internal potential; and the second detector detects a deviation from the predetermined level of the internal potential, based on the result of a comparison of the internal potential related potential with a second reference potential having a different level from the first reference potential.

According to an eleventh aspect, the semiconductor device of the tenth aspect further comprises: a first reference potential generating circuit which includes a first constant current source connected between a power-supply node and a first node supplying the first reference potential, and a first resistor connected between the first node and ground; and a second reference potential generating circuit which includes a second constant current source connected between the power-supply node and a second node supplying the second reference potential, and a second resistor connected between the second node and ground, the second resistor having a higher resistance value than the first resistor.

According to a twelfth aspect, the semiconductor device of the first aspect is characterized in that the first detector detects a deviation from the predetermined level of the internal potential, based on the result of a comparison of a reference potential with a first internal potential related potential related to the internal potential; and the second detector detects a deviation from the predetermined level of the internal potential, based on the result of a comparison of the reference potential with a second internal potential related potential that is related to the internal potential and is different from the first internal potential related potential.

According to a thirteenth aspect, the semiconductor device of the twelfth aspect further comprises: a level shifter for performing level shifting of the internal potential to supply first and second shift potentials of different levels to the first and second detectors, respectively, the first and second internal potential related potentials including the first and second shift potentials.

According to a fourteenth aspect, the semiconductor device of the thirteenth aspect is characterized in that the level shifter includes a resistor disposed between the output node and ground; and the first and second shift potentials are supplied from the node of the output node side of the resistor and the node of the ground side, respectively.

An object of the present invention is to provide a semiconductor device of a low power consumption.

Another object of the present invention is to reduce a through current passing through a circuit in which an internal potential is generated by a charge pump.

These and other objects, features aspects and advantages of the present invention will become more apparent from the following detailed description of the present invention when taken in conjunction with the accompanying drawings.

BRIEF DESCRIPTION OF THE DRAWINGS

FIG. 8 is a circuit diagram of a bit line separating signal generating circuit of the first preferred embodiment;

DESCRIPTION OF THE PREFERRED EMBODIMENTS

First Preferred Embodiment

Figure 1:
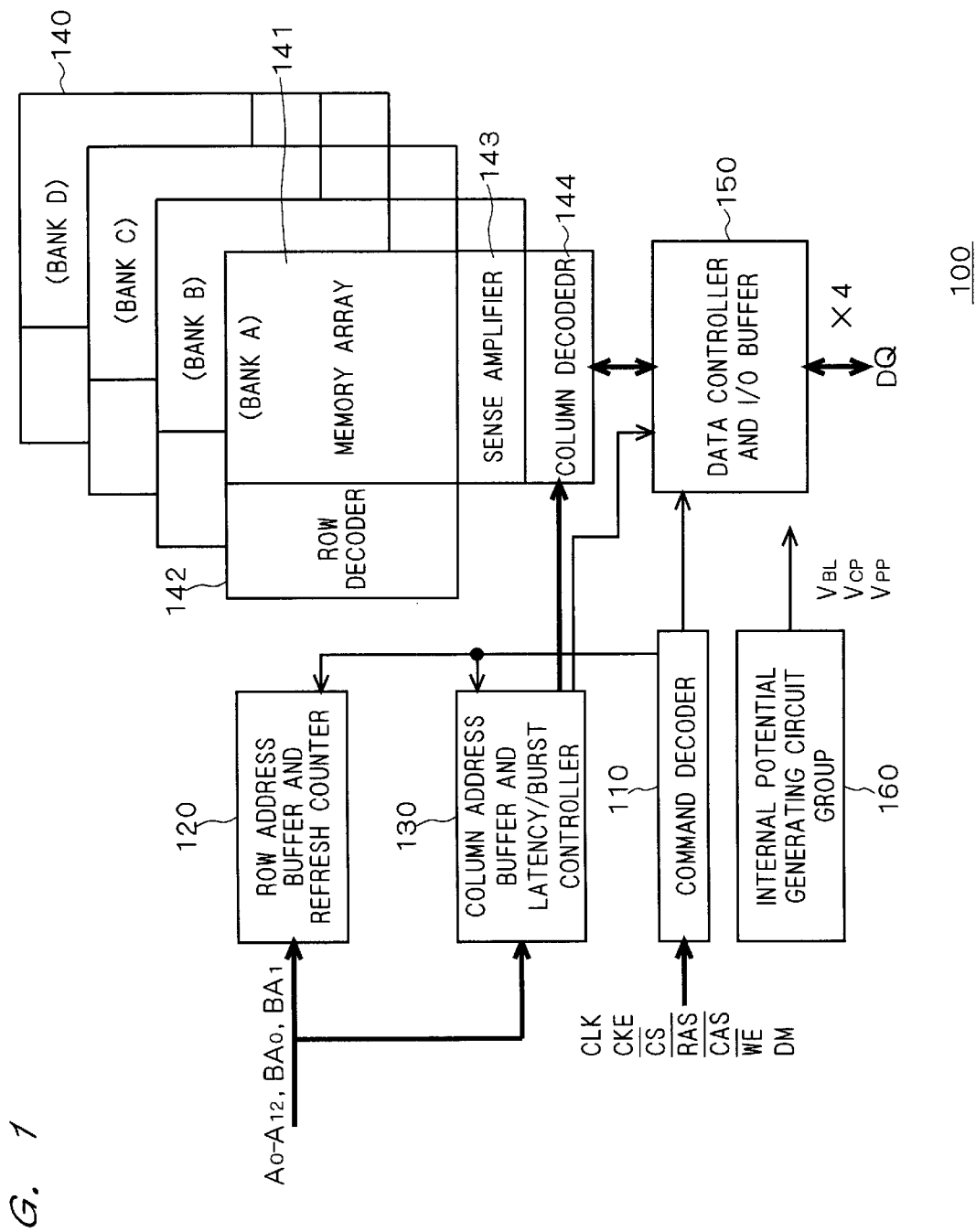
FIG. 1 is a block diagram of a DRAM according to a first preferred embodiment of the present invention.

A DRAM (dynamic random access memory) according to a first preferred embodiment will be described by referring to FIGS. 1 to 8. FIG. 1 is a schematic block diagram of a DRAM 100. Referring to FIG. 1, the DRAM 100 has a command decoder 110. The command decoder 110 latches a variety of control signals (e.g., clock enable signal CKE, chip select signal $\overline{CS}$, row address strobe signal $\overline{RAS}$, column address strobe signal $\overline{CAS}$, write enable signal $\overline{WE}$, and data mask signal DM) in synchronization with a clock signal CLK supplied from the exterior, and it decodes these control signals. An operation command is indicated by a logical combination of these control signals. Examples of commands are a bank activation command, read command, write command, precharge command, CBR refresh command, and self refresh command. The command decoder 110 decodes the supplied command and then outputs many kinds of internal control signals in order to control the operation of the DRAM 100 in response to the above command.

The DRAM 100 further comprises a row address buffer and refresh counter 120, which receives address signals $A_0$–$A_{12}$ containing multiple bits and bank address signals $BA_0$–$BA_1$ containing multiple bits, each being supplied from the exterior, and then outputs a row address signal and internal bank address signal. When the internal control signal from the command decoder 110 indicates that a bank activation command is supplied to the command decoder 110, the row address buffer and refresh counter 120 supplies the address signals $A_0$–$A_{12}$ and bank address signals $BA_0$–$BA_1$ as a row address signal and internal bank address signal, respectively.

When the internal control signal from the command decoder 110 indicates that a refresh command (e.g., CBR refresh command or self refresh command) is supplied to the command decoder 110, the row address buffer and refresh counter 120 for itself generates and supplies a row address signal and internal bank address, irrespective of the address signals $A_0$–$A_{12}$ and bank address signals $BA_0$–$BA_1$ supplied from the exterior.

The DRAM further comprises a column address buffer and latency/burst controller 130 which receives address signals $A_0$–$A_{12}$ and bank address signals $BA_0$–$BA_1$, each being supplied from the exterior, and then outputs a column address signal and internal bank address signal. When the internal control signal from the command decoder 110 indicates that a read command or write command is supplied to the command decoder 110, the column address buffer and latency/burst controller 130 supplies the address signals $A_0$–$A_{12}$ and bank address signals $BA_0$–$BA_1$, each being supplied from the exterior, as a column address signal and internal bank address signal, respectively.

When the internal control signal from the command decoder 110 indicates that a mode register set command is supplied to the command decoder 110, the column address buffer and latency/burst controller 130 sets $\overline{CAS}$ latency in response to a predetermined bit (e.g., $A_4$–$A_6$) of the address signals $A_0$–$A_{12}$ from the exterior, and sets a burst length in response to a predetermined other bit (e.g., $A_0$–$A_2$).

The DRAM 100 further comprises a plurality of banks 140 which are called bank A, B, C or D. Each bank has a memory array 141 in which a plurality of memory cells are disposed with multiple rows and multiple columns; row decoder 142 for selecting a row of the memory array 141; sense amplifier 143 for sensing and amplifying a memory cell data that is placed on a column of the memory array 141; and a column decoder 144 for selecting a column of the memory array 141. Each bank 140 is constructed so as to select a memory cell of an address independent of an address of a memory cell to be selected by other bank. Specifically, each bank can select any memory cell regardless of which memory cell is selected by other bank.

The row decoder 142 decodes a row address signal and internal bank address signal from the row address buffer and refresh counter 120, and selects a memory cell of the row in response to a row address signal (which is therefore also in response to the bank address signals $A_0$–$A_{12}$) of the bank 140 in response to the internal bank address signal (which is therefore also in response to the bank address signals $BA_0$–$BA_1$).

The sense amplifier 143 senses and amplifies the data of a memory cell on the row selected by the row decoder 142, which is placed on a column of the memory array 141. The column decoder 144 decodes a column address signal and internal bank address signal from the column address buffer and latency/burst controller 130. The column decoder 144 selects, from the data to be amplified by the sense amplifier 143, data at a row in response to a column address signal (which is therefore also in response to the address signals $A_0$–$A_{12}$) of the bank 140 in response to the internal bank address signal (which is therefore also in response to the bank address signals $BA_0$–$BA_1$).

The DRAM 100 further comprises a data controller and input/output buffer 150, from which data DQ is outputted from the memory array 141 to the exterior, in synchronization with a clock signal CLK, and in response to the internal control signal from the command decoder 110, and to the $\overline{CAS}$ latency and burst length set to the latency/burst controller 130. Also, the data controller and input/output buffer 150 supplies the memory array 141 data DQ to be supplied from the exterior, in synchronization with a clock signal CLK, and in response to the internal control signal from the command decoder 110, and to the burst length set to the column address buffer and latency/burst controller 130.

When the internal control signal from the command decoder 110 indicates that a read command is provided to the command decoder 110, the data controller and input/output buffer 150 starts outputting of a read data DQ after an elapse of the cycle of a clock signal CLK corresponding to the value of $\overline{CAS}$ latency after the read command is supplied. In read data outputting, an amount equivalent to a burst lenth is outputted serially to each of multiple (e.g., four) DQ pins. The data controller and input/output buffer 150 can serially output, to each DQ pin, the data from the memory array 141 selected by the column decoder 144.

When the internal control signal from the command decoder 110 indicates that a write command is provided to the command decoder 110, the data controller and input/output buffer 150 fetches therein sequentially a write data by an amount equivalent to a burst length to be supplied serially from the exterior to each DQ pin, in synchronization with a clock signal CLK, and then supplies the write data to a column of the memory array selected by the column decoder 144. Alternatively, it is possible to arrange so as not to fetch part of a write data provided serially from a data mask signal DM.

The DRAM 100 also has an internal potential generating circuit group 160 which outputs step-up potential $V_{PP}$ obtained by setting up power-supply potential $V_{DD}$; the precharge potential $V_{BL}$ of a bit line that is the intermediate potential, $$\frac{(V_{DD} + V_{SS})}{2},$$

between the power-supply potential $V_{DD}$ and $V_{SS}$; and a cell plate potential $V_{CP}$.

Figure 2:
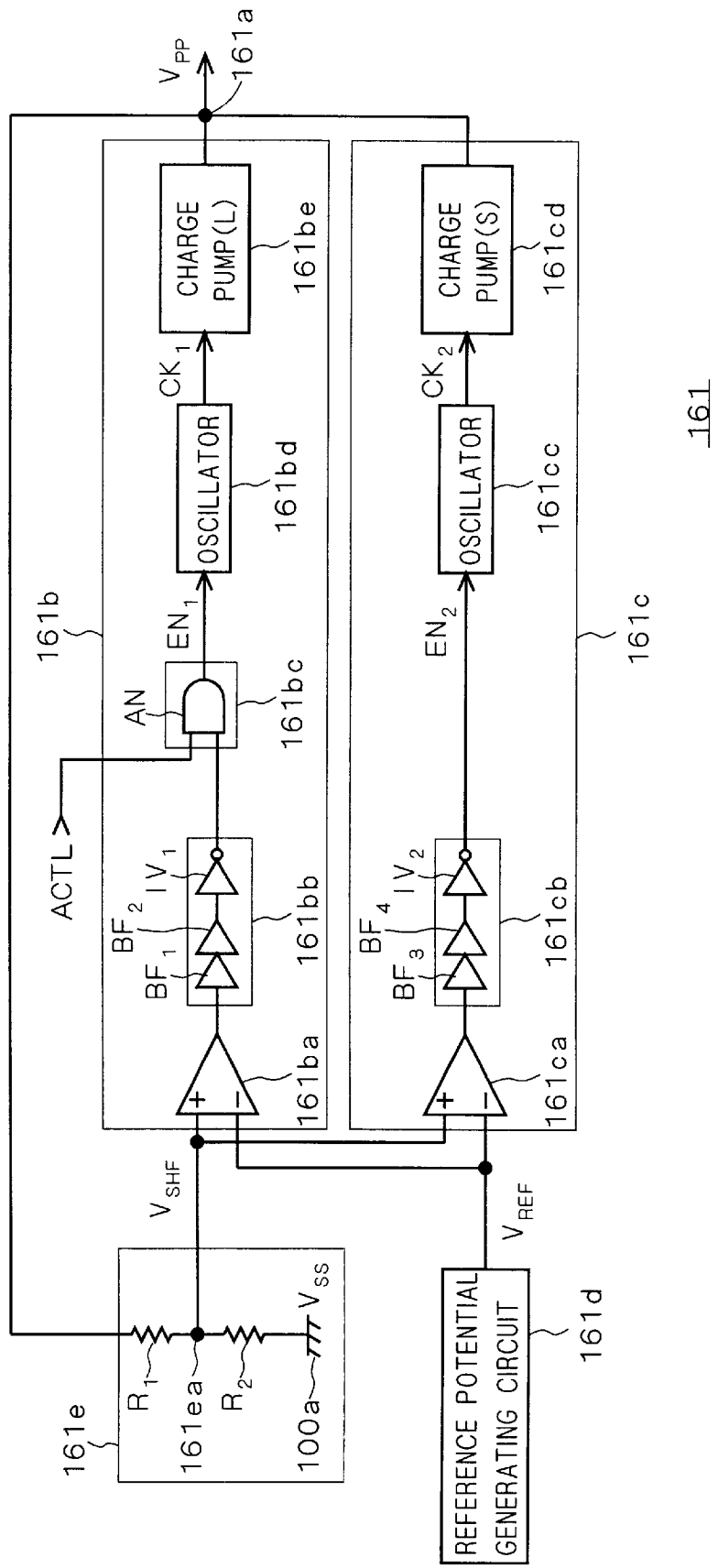
FIG. 2 is a circuit diagram of a boost circuit on the DRAM of the first preferred embodiment.

FIG. 2 is a circuit diagram illustrating the configuration of a boost circuit 161 contained in an internal potential generating circuit group 160. The boost circuit 161 is disposed per bank 140, for supplying step-up potential $V_{PP}$. Referring to FIG. 2, step-up potential $V_{PP}$ is generated at an output node 161a by the boost circuit 161. The boost circuit 161 has step-up potential generating circuits 161b and 161c.

The step-up potential generating circuit 161c normally senses the level of step-up potential $V_{PP}$ and, when the level lowers, executes the supply of step-up potential $V_{PP}$. The step-up potential generating circuit 161b receives an activation signal ACTL and, only when the signal ACTL indicates a high level indicating the active state, executes the supply of step-up potential $V_{PP}$ when the step-up potential $V_{PP}$ lowers. The activation signal ACTL becomes its high level in response to the activation indication of the corresponding bank 140. Accordingly, the step-up potential generating circuit 161b executes the supply of step-up potential $V_{PP}$ when the corresponding bank 140 is activated in response to a bank activation command. The activation signal ACTL is provided from the command decoder 110 shown in FIG. 1.

The boost circuit 161 further comprises a reference potential generating circuit 161d for generating reference potential $V_{REF}$, and a level shifter 161e that supplies a shift potential $V_{SHF}$ by performing level shifting of step-up potential $V_{PP}$.

The step-up potential generating circuit 161b has a detector 161ba that detects the deviation from a predetermined level of step-up potential $V_{PP}$. The detector 161ba receives reference potential $V_{REF}$ and shift potential $V_{SHF}$, compares these potentials, and outputs the comparison result based on the obtained deviation. The step-up potential generating circuit 161b further comprises a buffer circuit 161bb that receives and buffers the output of the detector 161ba. The buffer circuit 161bb has buffers $BF_1$, $BF_2$, and an inverter $IV_1$, which are connected in series. The input of the buffer $BF_1$ receives the output of the detector 161ba. Each of the buffers $BF_1$ and $BF_2$ is formed by an even number of inverters connected in series. Here, the detector 161ba may be configured so as to compare step-up potential $V_{PP}$ itself with the corresponding reference voltage.

The step-up potential generating circuit 161b further comprises a control circuit 161bc that receives an activation signal ACTL and the output of the buffer circuit 161bb, and provides a clock enable signal $EN_1$. The control circuit 161bc includes an AND gate AN that receives such two input signals. Alternatively, a logical circuit different from the AND gate may be added depending on the kind and number of input signals. The clock enable signal $EN_1$ becomes disable (low level) regardless of the output of the buffer circuit 161bb, when an activation signal ACTL is inactive indicating a low level, and it becomes the level responsive to the output of the buffer circuit 161bb when the activation signal ACTL is active indicating a high level.

The step-up potential generating circuit 161b further comprises an oscillator 161bd that oscillates a clock signal $CK_1$ in response to a clock enable signal $EN_1$. The oscillator 161bd oscillates a clock signal $CK_1$ when a clock enable signal $EN_1$ is at its high level indicating the enable state, and reduces a clock signal $CK_1$ to its low level when the signal is disable indicating a low level. The step-up potential generating circuit 161b further comprises a charge pump 161be by which a step-up potential $V_{PP}$ is generated at an output node 161a, in response to a clock signal $CK_1$. The charge pump 161be has a high capability of supplying step up potential $V_{PP}$.

The step-up potential generating circuit 161c has a detector 161ca that detects the deviation from a predetermined level of step-up potential $V_{PP}$. The detector 161ca receives reference potential $V_{REF}$ and shift potential $V_{SHF}$, compares these potentials, and outputs the comparison result in accordance with the deviation. The detector 161ca is ahead of the detector 161ba in detecting the deviation from a predetermined level of step-up potential $V_{PP}$. That is, the detector 161ca is ahead of the detector 161ba in detecting a decrease in step-up potential $V_{PP}$. Here, the detector 161ca may be configured so as to compare step-up potential $V_{PP}$ itself with the corresponding reference voltage.

The step-up potential generating circuit 161c further comprises a buffer circuit 161cb that receives the output of the detector 161ca and buffers this output, thereby to supply a clock enable signal $EN_2$. The buffer circuit 161cb has buffers $BF_3$, $BF_4$, and an inverter $IV_2$, which are connected in series. The input of the buffer $BF_3$ receives the output of the detector 161ca. Each of the buffers $BF_3$ and $BF_4$ is formed by an even number of inverters connected in series.

The step-up potential generating circuit 161c further comprises an oscillator 161cc that oscillates a clock signal $CK_2$ in response to a clock enable signal $EN_2$. Since the clock signal $CK_2$ is responsive to the output of the detector 161ca, the oscillator 161cc oscillates a clock signal $CK_2$ in response to the output of the detector 161ca. The oscillator 161cc oscillates a clock signal $CK_2$ when a clock enable signal $EN_2$ is enable indicating a high level and reduces a clock signal $CK_1$ to its low level when the signal is disable indicating a low level.

The step-up potential generating circuit 161c further comprises a charge pump 161cd by which a step-up potential $V_{PP}$ is generated at an output node 161a in accordance with a clock signal $CK_2$. The charge pump 161cd has a low capability of supplying step-up potential $V_{PP}$ but has a low power consumption, than the charge pump 161be. In the DRAM 100, the specification of current consumption is defined in detail, according to the status of operation, such as the standby or active state. The presence of the charge pumps 161be and 161cd having different supply capabilities and different current consumption as described above, allows to adjust current consumption so as to conform to the specification. For instance, in the standby status requiring no large supply capability, current consumption can be reduced by stopping the operation of the charge pump 161be.

The level shifter 161e has a resistor $R_1$ connected between the output node 161a and node 161ea, and a resistor $R_2$ connected between the node 161ea and ground 100a. Shift potential $V_{SHF}$ is supplied from the node 161ea. The resistors $R_1$ and $R_2$ may be a resistor composed of polysilicon, or a channel resistor of the transistor. Shift potential $V_{SHF}$ is derived as follows:

$$V_{SHF} = \frac{(V_{PP} - V_{SS}) \cdot r_2}{(r_1 + r_2)} + V_{SS}$$

wherein the resistance value of the resistors $R_1$ and $R_2$ are $r_1$ and $r_2$, respectively. In this preferred embodiment the resistors $R_1$ and $R_2$ are set so as to have a substantially equal value, and the ground potential $V_{SS}$ is normally 0 V. Accordingly, the shift potential $V_{SHF}$ is one half of step-up potential, that is, $$\frac{V_{PP}}{2}.$$

Figure 3:
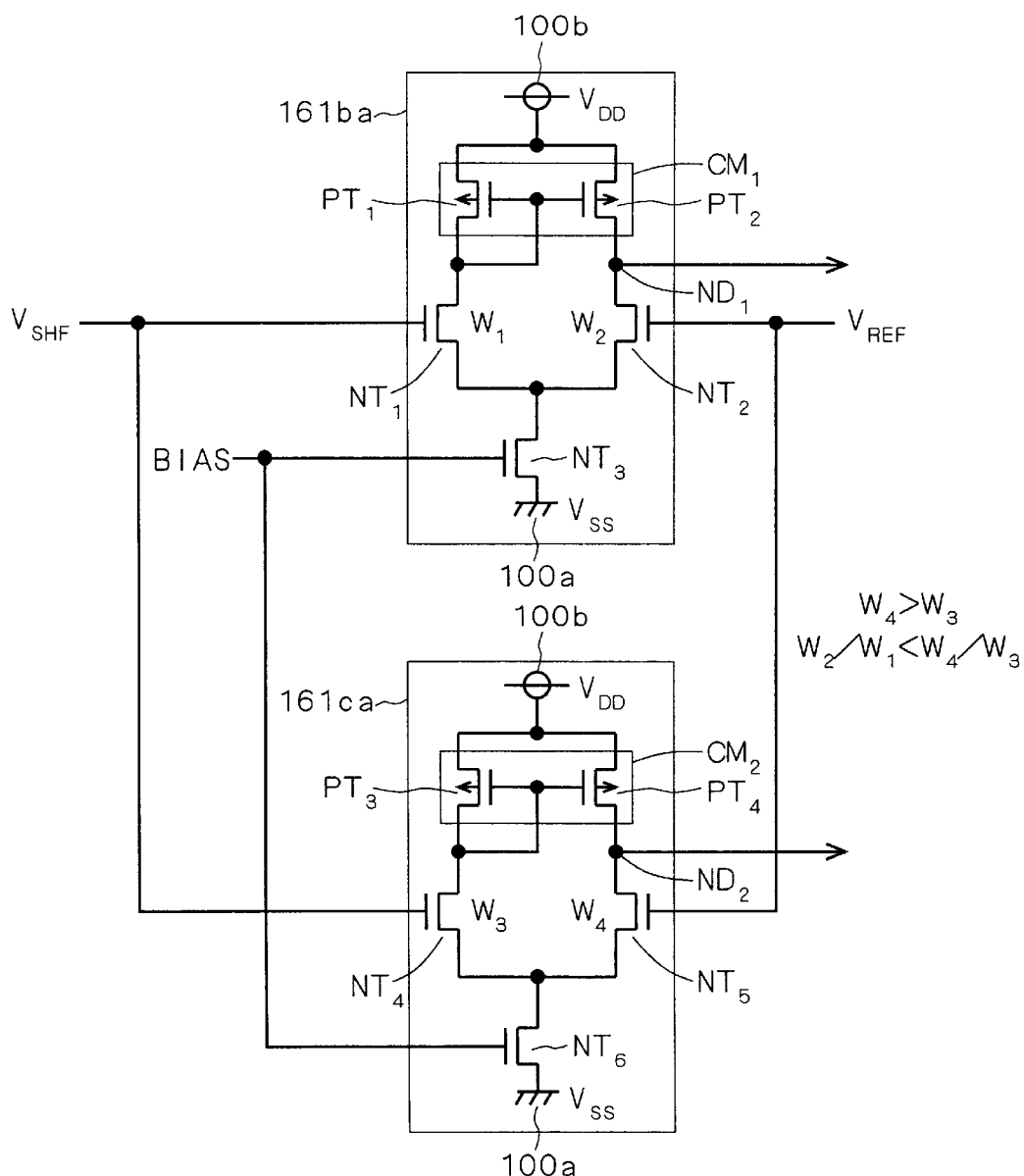
FIG. 3 is a circuit diagram of a detector on the boost circuit of the first preferred embodiment.

FIG. 3 is a circuit diagram illustrating the configuration of the detectors 161ba and 161ca shown in FIG. 2. Referring now to FIG. 3, the detector 161ba comprises a current mirror circuit $CM_1$, and n-channel MOS transistors $NT_1$ and $NT_2$ connected to the current mirror circuit $CM_1$. The n-channel MOS transistors $NT_1$ and $NT_2$ receive at their respective gates shift potential $V_{SHF}$ and reference potential $V_{REF}$. The detector 161ba further comprises an n-channel MOS transistor $NT_3$ which receives at its gate a bias potential BIAS falling in between power-supply potential $V_{DD}$ and ground potential $V_{SS}$. The drain of the n-channel MOS transistor $NT_3$ is connected in common to the respective sources of the n-channel MOS transistors $NT_1$ and $NT_2$. The source of the n-channel MOS transistor $NT_3$ is connected to ground 100a.

The current mirror circuit $CM_1$ comprises a p-channel Resistor $PT_1$ which has a drain and gate connected to the drain of the n-channel MOS transistor $NT_1$. The source of the p-channel MOS transistor $PT_1$ is connected to the power-supply node 100b. The current mirror circuit $CM_1$ further comprises a p-channel transistor $PT_2$ which has a drain connected to the drain of the n-channel MOS transistor $NT_2$. The p-channel MOS transistor $PT_2$ has a gate connected to the gate of the p-channel MOS transistor $PT_1$. The source of the p-channel MOS transistor $PT_2$ is connected to the power-supply node 100b. The output of the detector 116ba is supplied from a node $ND_1$ disposed between the p-channel MOS transistor $PT_2$ and n-channel MOS transistor $NT_2$.

The detector circuit 161ca comprises a current mirror $CM_2$, and n-channel MOS transistors $NT_4$ and $NT_5$ connected to the current mirror circuit $CM_2$. The n-channel MOS transistors $NT_4$ and $NT_5$ receive at their respective gates shift potential $V_{SHF}$ and reference potential $V_{REF}$. The detector 161ca further comprises an n-channel MOS transistor $NT_6$ which receives at its gate a bias potential BIAS. The drain of the n-channel MOS transistor $NT_6$ is connected in common to the respective sources of the n-channel MOS transistors $NT_4$ and $NT_5$. The source of the n-channel MOS transistor $NT_6$ is connected to the ground 100a.

The current mirror circuit $CM_2$ comprises a p-channel transistor $PT_3$ which has a drain and gate connected to the drain of the n-channel MOS transistor $NT_4$. The source of the p-channel MOS transistor $PT_3$ is connected to the power-supply node 100b. The current mirror circuit $CM_2$ further comprises a p-channel transistor $PT_4$ which has a drain connected to the drain of the n-channel MOS transistor $NT_5$. The p-channel MOS transistor $PT_4$ has a gate connected to the gate of the p-channel MOS transistor $PT_3$. The source of the p-channel MOS transistor $PT_4$ is connected to the power-supply node 100b. The output of the detector 161ca is supplied from a node $ND_2$ disposed between the p-channel MOS transistor $PT_4$ and n-channel MOS transistor $NT_5$.

It is set so that the n-channel MOS transistor $NT_5$ has a larger current drive capability than the n-channel MOS transistor $NT_4$. It is also set so that the ratio of the current drive capability of the channel MOS transistor $NT_5$ to the channel MOS transistor $NT_4$ is higher than the ratio of the current drive capability of the channel MOS transistor $NT_2$ to the channel MOS transistor $NT_1$.

The current drive capability depends on $\mu \cdot W/L$, wherein $\mu$ is the mobility of electrons; W is the channel width of a transistor; and L is the channel length of the transistor. Therefore, the current drive capability is adjustable by changing the doping amount of impurity ions to the channel. Alternatively, the current drive capability can be increased by increasing the channel width W, or decreasing the channel length L. In this preferred embodiment, it is so designed that all the n-channel transistors $NT_1$, $NT_2$, $NT_4$ and $NT_5$ have the same mobility of electrons and the same channel length, and that a difference in current drive capability is produced by changing the channel width.

Specifically, in this embodiment the channel width $W_4$ of the n-channel MOS transistor $NT_5$ is greater than the channel width $W_3$ of the n-channel MOS transistor $NT_4$. The ratio of the channel width $W_4$ of the n-channel MOS transistor $NT_5$ to the channel width $W_3$ of the n-channel MOS transistor $NT_4$ (i.e., $W_4/W_3$,) is greater than the ratio of the channel width $W_2$ of the n-channel MOS transistor $NT_2$ to the channel width $W_1$ of the n-channel MOS transistor $NT_1$ (i.e., $W_2/W_1$). In this embodiment it is especially designed for $W_1 = W_2 = W_3 < W_4$. The channel width $W_4$ of the n-channel MOS transistor $NT_5$ can be increased merely by increasing the channel width of a single transistor. Alternatively, it is possible to increase the channel width by connecting in parallel two transistors having the same channel width.

In the detector 161ba, the n-channel MOS transistors $NT_1$ and $NT_2$ have the same current drive capability and the same volt-ampere characteristic. Accordingly, the detector 161ba outputs a low level signal to the node $ND_1$ when the shift potential $V_{SHF}$ is lower than the reference potential $V_{REF}$. On the other hand, in the detector 161ca, the n-channel MOS transistor $NT_5$ has a larger current drive capability than the n-channel MOS transistor $NT_4$, and therefore, the detector 161ca outputs a low level signal to the node $ND_2$ under conditions where shift potential $V_{SHF}$ is slightly higher than reference potential $V_{REF}$. That is, the detector 161ca outputs a low level signal before shift potential $V_{SHF}$ is reduced to reference potential $V_{REF}$.

Thus, the detector 161ca can be ahead of a detector 161ba in detecting a decrease in step-up potential $V_{PP}$, by allowing the transistors to have different current drive capabilities. As a result, when an activation signal ACTL is at its low level, the output of the detector 161ba reaches its high level. This permits a reduction in the through current passing through the buffer circuit 161bb. Even when an activation signal ACTL is at its high level, the charge pump 161be is not required to operate by arranging so that the detector 161ca is ahead in detecting a decrease in step-up potential $V_{PP}$, and the charge pump 161cd operates to increase the step-up potential $V_{PP}$. It is therefore possible to reduce power consumption by the amount that the charge pump 161be does not operate which has a large capability of supplying step-up potential $V_{PP}$ but requires a large power consumption.

Figure 4:
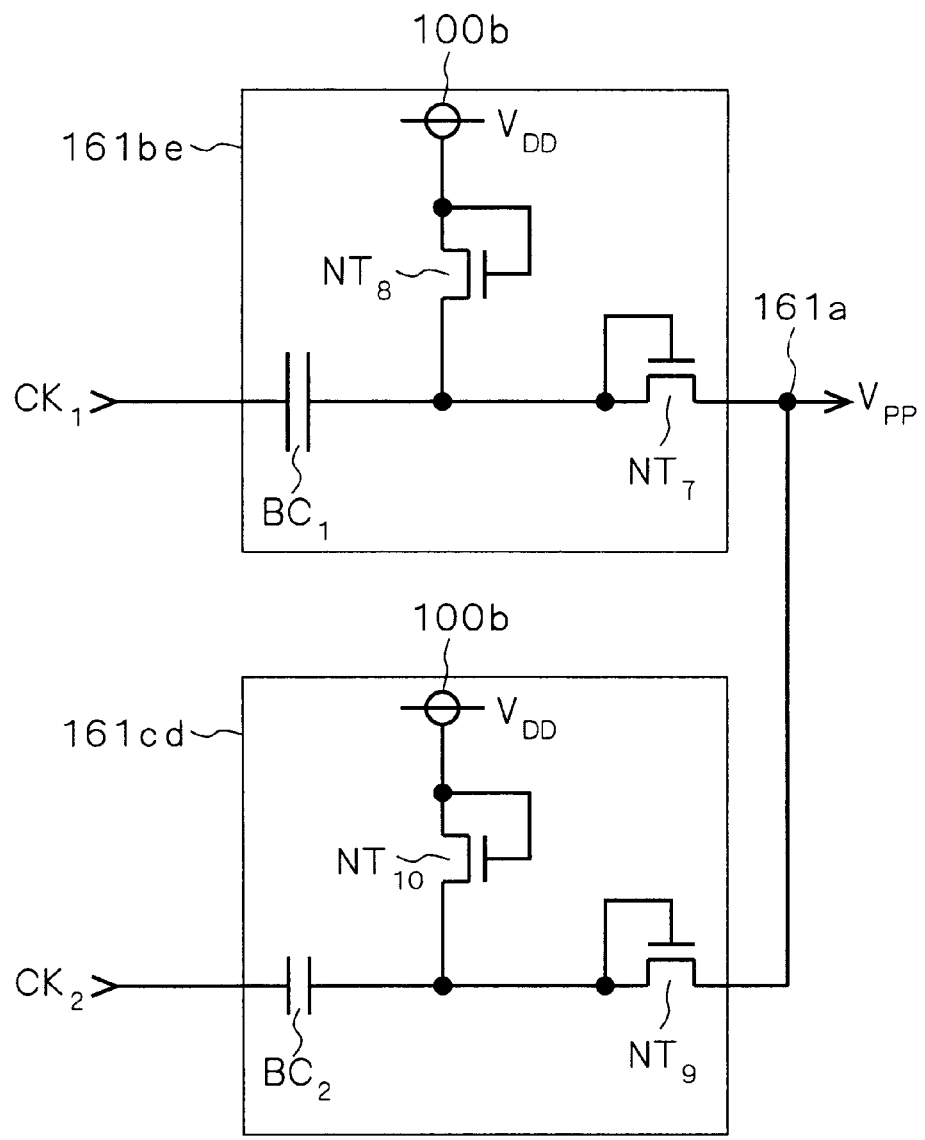
FIG. 4 is a circuit diagram of a charge pump on the boost circuit of the first preferred embodiment.

FIG. 4 is a circuit diagram illustrating the configuration of the charge pumps 161be and 161cd shown in FIG. 2. Referring to FIG. 4, the charge pump 161be comprises a boost capacitor $BC_1$ which receives at one electrode a clock signal $CK_1$. The capacitance value of the boost capacitor $BC_1$ determines the magnitude of the capability of supplying step-up potential $V_{PP}$. The charge pump 161be has a large supply capability because it is designed so that the boost capacitor $BC_1$ has a high capacitance value. This, however, increases the amount of power consumed when the boost capacitor $BC_1$ is charged or discharged.

The charge pump 161be further comprises a driver transistor $NT_7$ connected between the other electrode of the boost capacitor $BC_1$ and an output node 161a. The driver transistor $NT_7$ is formed by an n-channel MOS transistor in which a gate is connected to the other electrode of the boost capacitor $BC_1$. The charge pump 161be further comprises a charging transistor $NT_8$ connected between the other electrode of the boost capacitor $BC_1$ and a power-supply node 100b. The charging transistor $NT_8$ is formed by an n-channel MOS transistor in which a gate is connected to the power-supply node 100b.

The charge pump 161cd comprises a boost capacitor $BC_2$ which receives at one electrode a clock signal $CK_2$. Since it is designed so that the boost capacitor $BC_2$ has a smaller capacitance value than the boost capacitor $BC_1$, the charge pump 161cd has a smaller supply capability than the charge pump 161be, but less power is consumed when the boost capacitor $BC_2$ is charged or discharged.

The charge pump 161cd further comprises a driver transistor $NT_9$ connected between the other electrode of the boost capacitor $BC_2$ and the output node 161a. The driver transistor $NT_9$ is formed by an n-channel MOS transistor in which a gate is connected to the other electrode of the boost capacitor $BC_2$. The charge pump 161cd further comprises a charging transistor $NT_{10}$ connected between the other electrode of the boost capacitor $BC_2$ and the power-supply node 100b. The charge transistor $NT_{10}$ is formed by an n-channel MOS transistor in which a gate is connected to the power-supply node 100b.

Modification may be made in this preferred embodiment, such as transposing shift potential $V_{SHF}$ and reference potential $V_{REF}$ to be inputted to the detectors 161ba and 161ca, respectively. In this case, since the output logical of the detectors 161ba and 161ca is reversed, there is no need to provide inverters $IV_1$ and $IV_2$ on their respective buffer circuits 161bb and 161cb. The n-channel MOS transistors in the detectors 161ba and 161ca have a channel width relationship of $W_3 > W_4$ and $W_4/W_3 < W_2/W_1$.

Figure 5A:
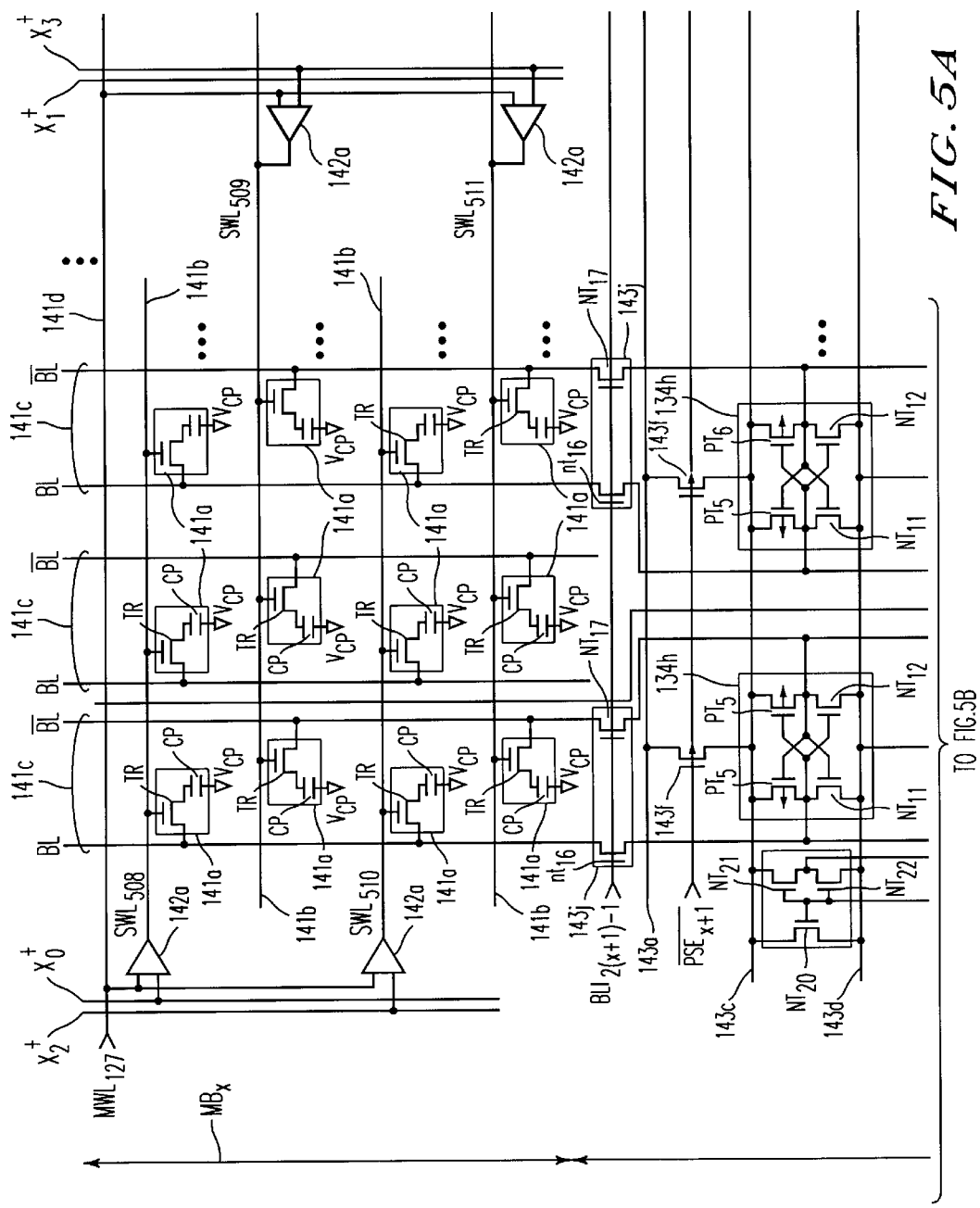
FIG. 5 is a circuit diagram of an important part in the DRAM of the first preferred embodiment.
Figure 5B:
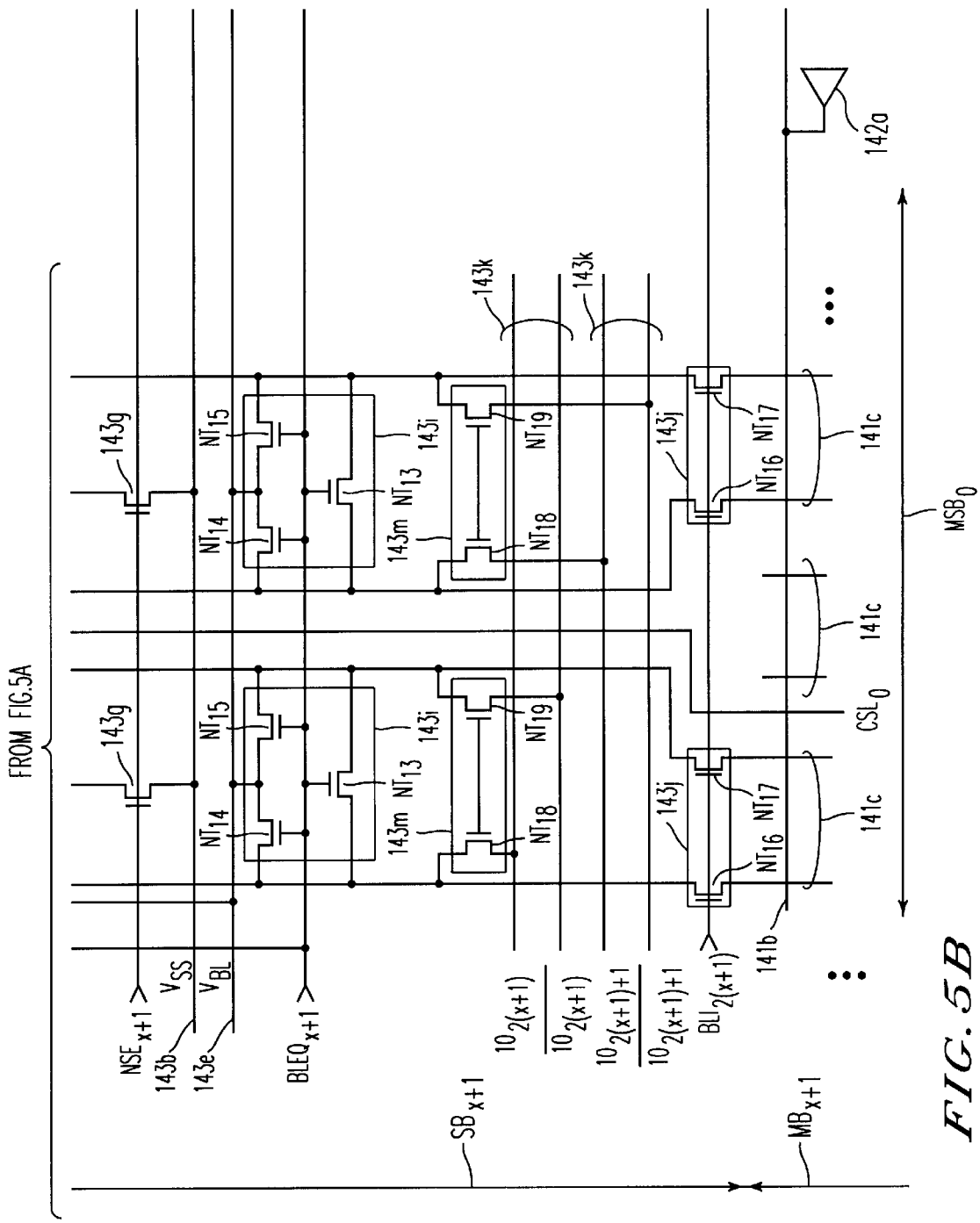

Description will now be made of the intended use of step-up potential $V_{PP}$ generated by a boost circuit 161. FIG. 5 is a circuit diagram illustrating in part the memory array 141, row decoder 142 and sense amplifier 143, which are shown in FIG. 1. The memory array 141 is divided into a plurality of memory blocks $MB_i$ (i=0–15), part of which is omitted in FIG. 5. Sense amplification bands $SB_j$ (j=0–16) are provided at opposite sides so as to sandwich the respective memory blocks $MB_i$. The sense amplification band $SB_j$ are contained in the sense amplifier 143 of FIG. 1. A sense amplification band $SB_{x+1}$ disposed between memory blocks $MB_x$ and $MB_{x+1}$ (x=0–14) is common to two adjacent both memory blocks $MB_x$ and $MB_{x+1}$. That is, a so-called shared sense amplification configuration is employed in the DRAM 100.

Each memory block $MB_i$ has a plurality of memory cells 141a which are avenged with multiple rows and multiple columns. Each memory block $MB_i$ is divided into memory sub-blocks $MSB_k$ (k=0–15) which have a plurality of columns of the memory cells 141a (only $MSB_0$ is shown in FIG. 5). Each memory sub-blocks $MSB_k$ comprises a plurality of subword lines 141b that are provided so as to correspond to their respective rows of the memory cells 141a. Each subword line 141b is connected to the memory cell 141a at the corresponding row. Each memory sub-blocks $MSB_k$ further comprises a plurality of paired bit lines 141c (BL, $\overline{BL}$) which are provided so as to correspond to their respective rows of the memory cells 141a. Each of the paired bit lines 141c is connected to the memory cell 141a at the corresponding column.

Each memory cell 141a comprises a memory capacitor CP which receives at one electrode a cell plate potential $V_{CP}$, and a memory transistor TR which is connected between the other electrode of the memory capacitor CP and a bit line BL or $\overline{BL}$ forming the paired bit lines 141c, and is formed by an n-channel MOS transistor in which a gate is connected to the subword line 141b.

In addition, a plurality of main word lines 141d are provided in common to the multiple memory sub-blocks $MSB_k$ in each memory block $MB_i$. The main word lines 141d and subword lines 141b extend in the row direction, and the paired bit lines 141c extend in the column direction. Four subword lines 141b in each memory sub-block $MSB_k$ correspond to a single main word line 141d.

A plurality of subword drivers 142a connected to their respective subword lines 141b are disposed at opposite sides so as to sandwich the corresponding memory sub-blocks $MSB_k$. The subword drivers 142a are contained in the row decoder 142 shown in FIG. 1. Each subword driver 142a supplies step-up potential $V_{PP}$ to the corresponding subword line 141b, in response to a main word signal $MWL_m$ (m=0–127) transmitted from the corresponding main word line 141d, and to a row decode signal $X_n^+$ (n=0, 1, 2, or 3; and "+" indicates that it becomes step-up potential $V_{PP}$ higher than power-supply potential $V_{DD}$) which accords with an address signal. That is, the step-up potential $V_{PP}$ is utilized to step up the selected subword line 141b. In response to an address signal, the row decoder 142 of FIG. 1 selects one from 128 main word lines 141d, and reduces a main word signal $MWL_m$ to its low level, which is then supplied to the selected main word line 141d.

Each sense amplification band $SB_j$ comprises a power-supply line 143a to which power-supply potential $V_{DD}$ is supplied; a power-supply line 143b to which ground potential $V_{SS}$ is supplied; a common source line 143c; a common source line 143d; and a precharge potential line 143e for remitting a bit line precharge potential $V_{BL}$. The sense amplification band $SB_j$ further comprises a p-channel MOS transistor 143f that charges the common source line 143c to power-supply potential $V_{DD}$, in response to a sense amplification enable signal $\overline{PSE}$; and an n-channel MOS transistor 143g that discharges the common source line 143d to ground potential $V_{SS}$, in response to a sense amplification enable signal $NSE_j$.

Each sense amplification band $SB_j$ further comprises a plurality of sense amplifiers 143h by which a potential difference of the paired bit lines 141c is amplified so that the potential of one bit line becomes power-supply potential $V_{DD}$ and the potential of the other becomes ground potential $V_{SS}$. Each sense amplifier 143h comprises p-channel MOS transistors $PT_5$ and $PT_6$ connected to a cross couple, by which either a bit line BL or $\overline{BL}$ having a higher potential is amplified up to power-supply potential $V_{DD}$; and n-channel MOS transistors $NT_{11}$ and $NT_{12}$ connected to a cross couple, by which either a bit line BL or $\overline{BL}$ having a lower potential is amplified up to ground potential $V_{SS}$. To the sense amplifier 143h, power-supply potential $V_{DD}$ and ground potential $V_{SS}$ are provided from the power-supply lines 143a and 143b.

Each sense amplification band $SB_j$ further comprises a bit line precharge/equalizing circuit 143i that equalizes/precharges the potential of a bit line BL or $\overline{BL}$, in response to a bit line equalizing signal $BLEQ_j$. The bit line precharge/equalizing circuit 143i comprises an n-channel MOS transistor $NT_{13}$ for equalizing the potential of a bit line BL or $\overline{BL}$, in response to a bit line equalizing signal $BLEQ_j$; and n-channel MOS transistors $NT_{14}$ and $NT_{15}$ for precharging the potential of a bit line BL or $\overline{BL}$, in response to a bit line equalizing signal $BLEQ_j$.

Each sense amplification band $SB_j$ further comprises a separated gate circuit 143j connected between the paired bit lines 141c and sense amplifier 143h. The separated gate circuit 143h includes n-channel MOS transistors $NT_{16}$ and $NT_{17}$ arranged in pairs, each having a gate that receives a bit line isolation signal $BLI_{2j-1}$ or $BLI_{2j}$. The bit line isolation signals $BLI_{2j-1}$ and $BLI_{2j}$ become step-up potential $V_{PP}$ or ground potential $V_{SS}$ in response to an address signal. That is, the step-up potential $V_{PP}$ is utilized to step up the bit line isolation signals $BLI_{2j-1}$ and $BLI_{2j}$. In response to a bit line isolation signal $BLI_{2j-1}$ or $BLI_{2j}$, each gate isolation circuit 143j isolates the corresponding paired bit lines 141c from the sense amplifier 143h and bit line precharge/equalizing circuit 143i.

Each sense amplification band $SB_j$ further comprises a data bus 143k having paired data bus lines, by which data is transmitted from the memory any 141; and a data transfer circuit 143m having n-channel MOS transistors $NT_{18}$ and $NT_{19}$, by which the paired bit lines 141c and data bus 143k are selectively connected together, in response to a column selection signal $CSL_p$ (p=0, 1, ... ).

Each sense amplification band $SB_j$ further comprises a common source line precharge/equalizing circuit 143n that precharges/equalizes the potential of common source lines 143c and 143d, in response to a bit line equalizing signal $BLEQ_j$. The common source line precharge/equalizing circuit 143n further comprises an n-channel MOS transistor $NT_{20}$ for equalizing the potential of the source lines 143c and 143d, in response to a bit line equalizing signal $BLEQ_j$; and n-channel MOS transistors $NT_{21}$ and $NT_{22}$ that precharge the potential of the common source lines 143c and 143d up to bit line precharge potential $V_{BL}$; in response to a bit line equalizing signal $BLEQ_j$.

Figure 6:
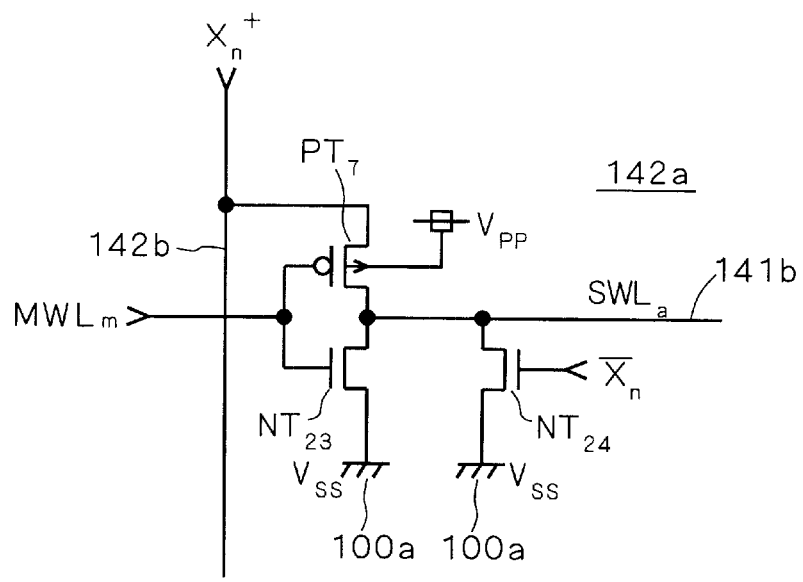
FIG. 6 is a circuit diagram of a subword driver in the DRAM of the first preferred embodiment.

FIG. 6 is a circuit diagram illustrating an example of a subword driver 142a. Referring to FIG. 6, the subword driver 142a comprises a p-channel MOS transistor $PT_7$ connected between a row decode signal line 142b and subword line 141b. The p-channel MOS transistor $PT_7$ has a gate that receives a main word signal $MWL_m$ transmitted from the main word line 141d. The back gate of the p-channel MOS transistor $PT_7$ receives step-up potential $V_{PP}$.

The subword driver 142a further comprises an n-channel MOS transistor $NT_{23}$ which is connected between a subword line 141b and ground 100a, and has a gate for receiving a main word signal $MWL_m$ transmitted from the main word line 141d; and an n-channel MOS transistor $NT_{24}$ which is connected between a subword line 141b and ground 100a, and has a gate for receiving the reverse signal $\overline{X_n}$, of a row decode signal $X_a^+$ (the reverse signal has $V_{DD}$-$V_{SS}$ amplitude, unlike $V_{PP}$-$V_{SS}$ amplitude in $X_n^+$).

Figure 7:
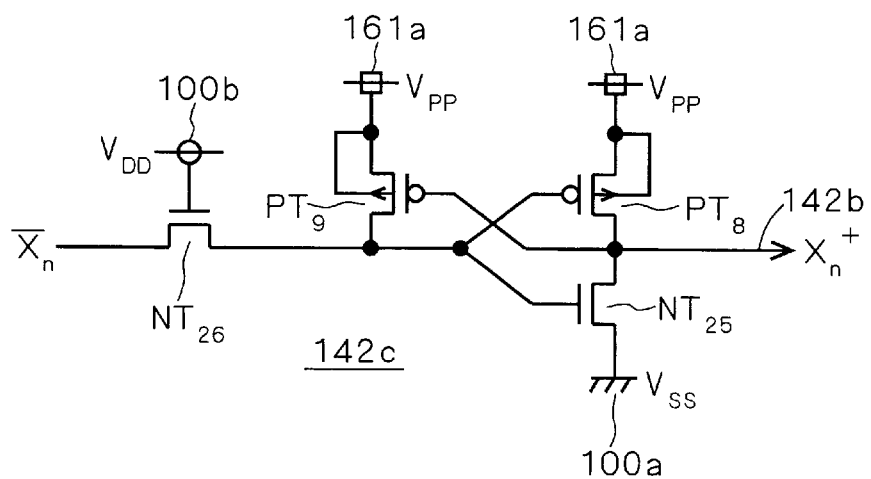
FIG. 7 is a circuit diagram of a step-up converter in the DRAM of the first preferred embodiment.

FIG. 7 is a circuit diagram of a step-up converter 142c for generating a row decode signal $X_n^+$. Referring to FIG. 7, the soup converter 142c comprises a p-channel MOS transistor $PT_8$ connected between an output node 161a of a boost circuit 161 and a row decode signal line 142b; and an n-channel MOS transistor $NT_{25}$ connected between the row decode signal line 142b and ground 100a. The gate of the n-channel MOS transistor $NT_{25}$ is connected to the gate of the p-channel MOS transistor $PT_8$.

The step-up converter 142c further comprises a p-channel MOS transistor $PT_9$ that is connected between the output node 161a, and the gate of the n-channel MOS transistor $NT_{25}$ and p-channel MOS transistor $PT_8$; and an n-channel MOS transistor $NT_{26}$ that is connected between the input receiving a row decode signal $\overline{X_n}$, and the gate of the n-channel MOS transistor $NT_{25}$ and p-channel MOS transistor $PT_8$. The gate of the n-channel MOS transistor $NT_{26}$ is connected to the power-supply node 100b.

In accordance with a low 2-bit of a row address signal, one of row decode signals $\overline{X_n}$ becomes its low level. The step-up converter 142 receiving a row decode signal $\overline{X_n}$ of a low level converts the corresponding row decode signal $X_n^+$ to step-up potential $V_{PP}$. The row decode signal $X_n^+$ stepped up by using the step-up potential $V_{PP}$ is then supplied to the subword line 141b by the subword driver 142a.

FIG. 8 is a circuit diagram illustrating the configuration of a bit line isolation signal generating circuit 142d. A bit line isolation signal BLI is generated, based on a block selection signal BS, by a similar circuit to the step-up converter 142c shown in FIG. 7. The correspondence relationships are as follows: signals $BS_j$ and $BS_{j-1}$ correspond to signals $\overline{X_n}$; signals $BLI_{2j-1}$ and $BLI_{2j}$ correspond to signal $X_n^+$; p-channel MOS transistors $PT_{18}$ and $PT_{19}$, and $PT_{28}$ and $PT_{29}$ correspond to $PT_8$ and $PT_9$; and n-channel MOS transistors $NT_{125}$ and $NT_{126}$, and $NT_{225}$ and $NT_{226}$ correspond to $NT_{25}$ and $NT_{26}$, respectively. In response to a row address signal, one of the block selection signals BS becomes its high level. Two bit line separation signals BLI corresponding to the high level block selection signal become their low level. The remaining bit line isolation sins are stepped up by using step-up potential $V_{PP}$, and then supplied to the gate isolation circuit 143j shown in FIG. 5. For instance, when a block selection signal $BS_j$ becomes its high level, bit line isolation signals $BLI_{2j-1}$ and $BLI_{2j+2}$ become their low level. When a block selection signal $BS_{j-1}$ becomes its high level, bit line isolation signals $BLI_{2j-3}$ and $BLI_{2j}$ become their low level. For the sake of convenience, FIG. 8 merely shows part of the bit line isolation signal $BLI_{2j-1}$ to be controlled by the block selection signal $BS_j$, and part of the bit line isolation signal $BLI_{2j}$ to be controlled by the block selection signal $BS_{j-1}$.

Second Preferred Embodiment

A DRAM according to a second preferred embodiment will now be described by referring to FIG. 9. This DRAM differs from the DRAM of the first preferred embodiment in the configuration of a boost circuit 161. In the foregoing embodiment, a common reference potential $V_{REF}$ is supplied to the detectors 161ba and 161ca, and the detector 161ca is ahead of the detector 161ba in detecting a decrease in step-up potential $V_{PP}$, by adjusting the channel width of the transistors in the detectors 161ba and 161ca. In the second preferred embodiment, detectors 161ba and 161ca are configured as shown in FIG. 3, and the channel widths $W_1$, $W_2$, $W_3$ and $W_4$ of their respective n-channel MOS transistors $NT_1$, $NT_2$, $NT_3$ and $NT_4$ are all the same.

In the second preferred embodiment, the detector 161ca is ahead of the detector 161ba in detecting a decrease in step-up potential $V_{PP}$, with the configuration that reference potentials $V_{REFL}$ and $V_{REFS}$ are supplied to both detectors 161ba and 161ca, and the reference potential $V_{REFS}$ is made higher than $V_{REFL}$. Other circuit configurations are the same as the first preferred embodiment. Therefore, its description is omitted herein, and only different parts will be described hereafter. As another configuration, detectors 161ba and 161ca may compare step-up potential $V_{PP}$ itself with its corresponding first and second reference potentials.

Figure 9:
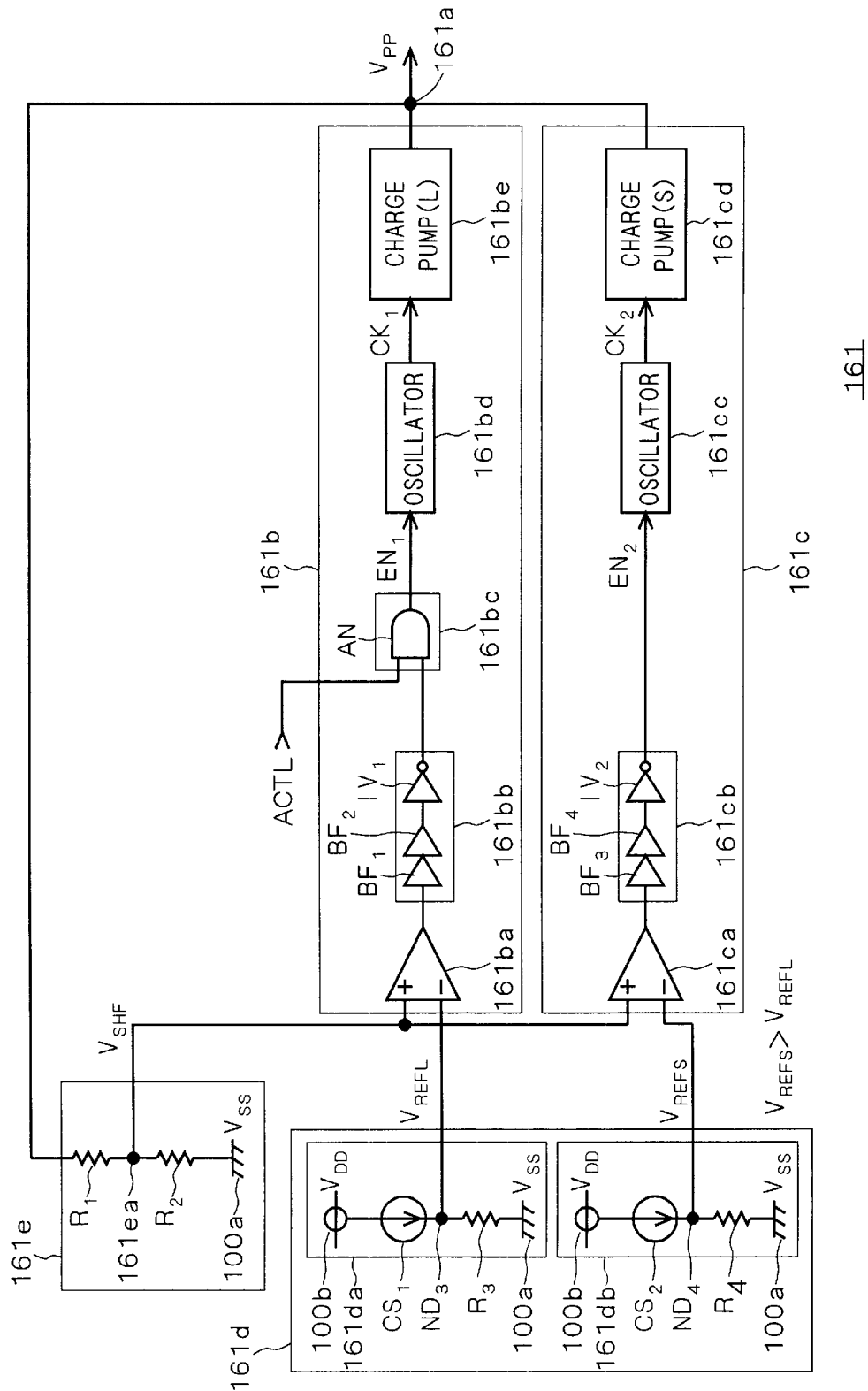
FIG. 9 is a circuit diagram of a boost circuit in a DRAM according to a second preferred embodiment.

Referring to FIG. 9, a reference potential generating circuit 161d supplies the detector 161ca reference potential $V_{REFS}$ higher than reference potential $V_{REFL}$. The reference potential generating circuit 161d comprises a reference potential generating circuit 161da generating reference potential $V_{REFL}$, and a reference potential generating circuit 161db generating reference potential $V_{REFS}$. The reference potential generating circuit 161da has a constant current source $CS_1$ that is connected between a power-supply node 100b, and a node $ND_3$ from which reference potential $V_{REFL}$ is supplied; and a resistor $R_3$ connected between the node $ND_3$ and ground 100a.

The reference potential generating circuit 161db comprises a constant current source $CS_2$ connected between the power-supply node 100b, and a node $ND_4$ from which reference potential $V_{REFS}$ is supplied; and a resistor $R_4$ connected between the node $ND_4$ and ground 100a The resistor $R_4$ has a higher resistance value than the resistor $R_3$, thereby supplying reference potential $V_{REFS}$ higher than reference potential $V_{REFL}$. That is, the detector 161ca can be ahead of the detector 161ba in detecting a decrease in step-up potential $V_{PP}$. As a result, like the first preferred embodiment, when an activation signal ACTL is at its low level, the output of the detector 161ba becomes its high level, thereby to reduce a through current passing through a buffer circuit 161bb.

Even when an activation signal ACTL is at its high level, the charge pump 161bc is not required to operate by arranging so that the detector 161ca is ahead in detecting a decrease in step-up potential $V_{PP}$, and a charge pump 161cd operates to increase the step-up potential $V_{PP}$. This enables to reduce power consumption by the amount that the charge pump 161 be requiring a large power consumption does not operate.

Further, different reference potentials $V_{REFS}$ and $V_{REFL}$ described in the second embodiment can be applied to the configuration with different channel widths described in the first embodiment.

Third Preferred Embodiment

A DRAM according to a third preferred embodiment will now be described by referring to FIG. 10. This DRAM differs from the DRAM of the second preferred embodiment in the configuration of a boost circuit 161. In the second embodiment, reference potentials $V_{REFS}$ and $V_{REFL}$, and common shift potential $V_{SHF}$ are supplied to both detectors 161ba and 161ca. Whereas in the third preferred embodiment, common reference potential $V_{REF}$ is used as a reference potential supplied to detectors 161ba and 161ca, as in the first preferred embodiment.

In the third preferred embodiment, the detector 161ca is ahead of the detector 161ba in detecting a decrease in step-up potential $V_{PP}$, with the configuration that both shift potentials $V_{SHFL}$ and $V_{SHFS}$ are supplied to the detectors 161ba and 161ca, and the shift potential $V_{SHFS}$ is lower than $V_{SHFL}$. Other circuit configurations are the same as the second preferred embodiment Therefore, its description is omitted herein, and only different parts will be described hereafter.

Figure 10:
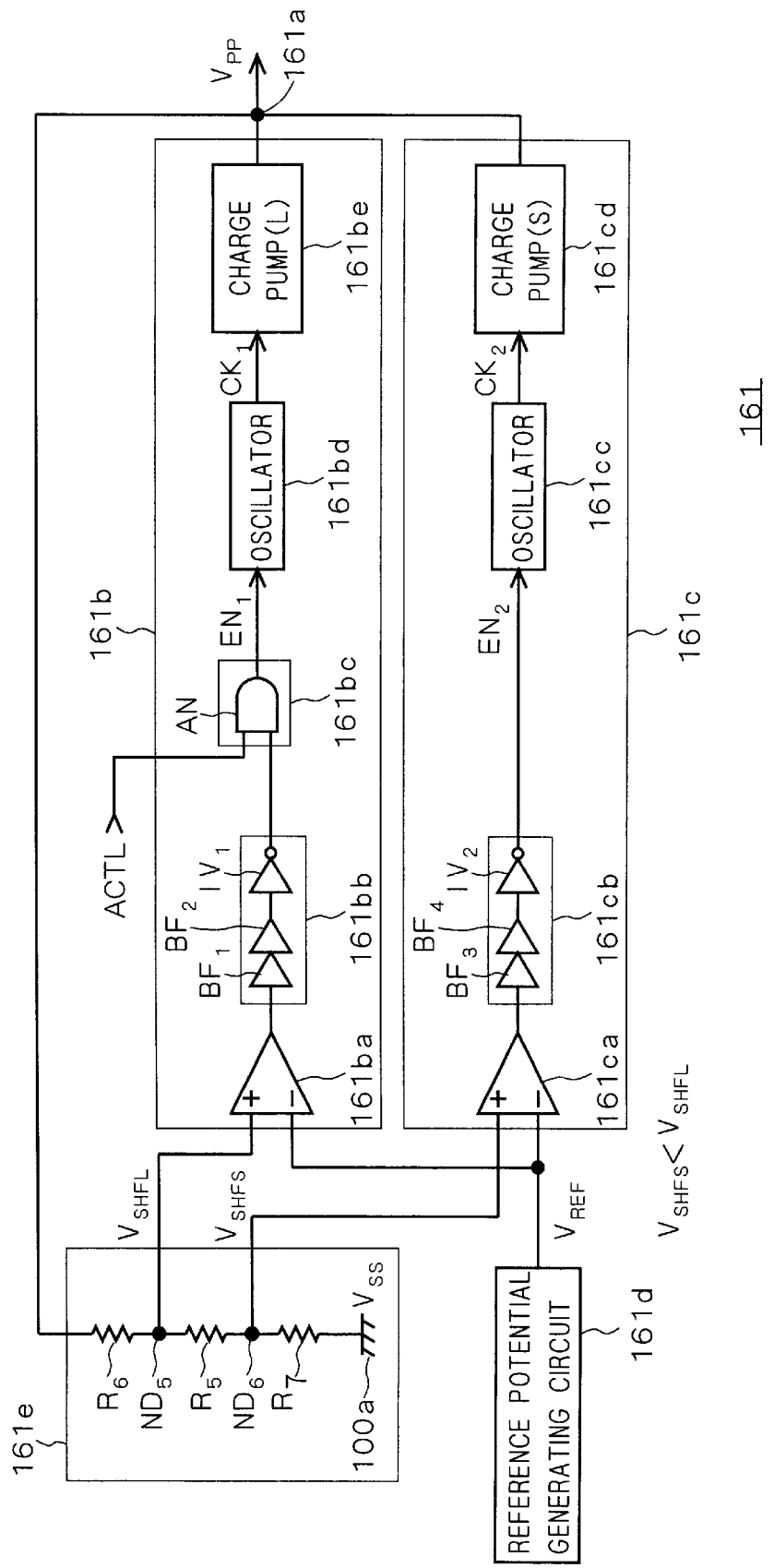
FIG. 10 is a circuit diagram of a boost circuit in a DRAM according to a third preferred embodiment.
Figure 11:
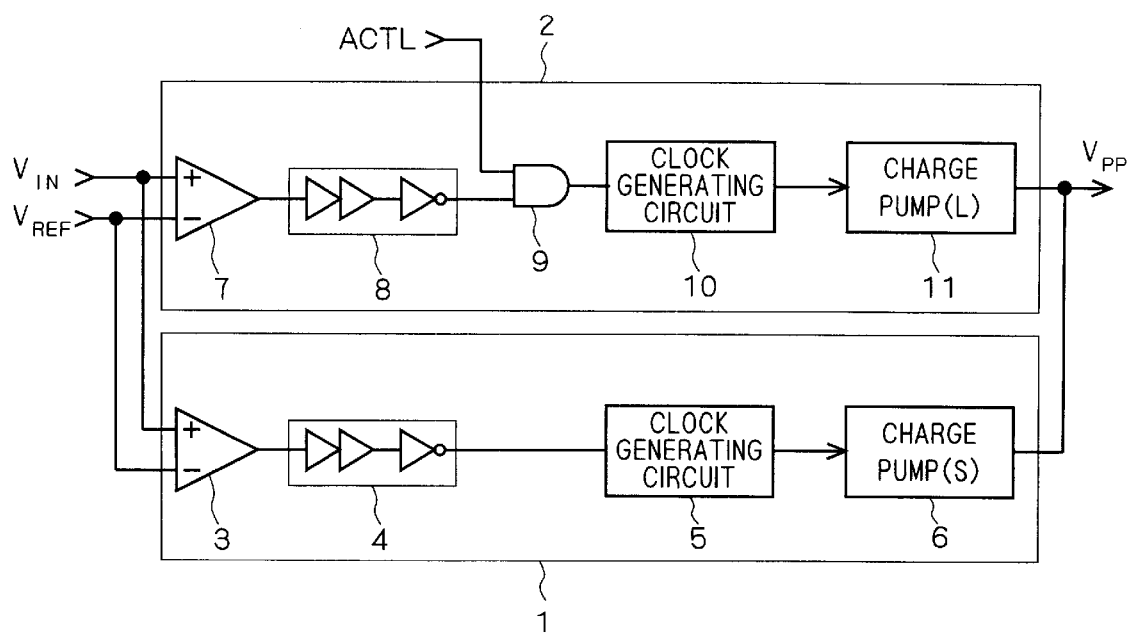
FIG. 11 is a circuit diagram of a conventional boost circuit.

Referring to FIG. 10, a level shifter 161e supplies the detector 161ca shift potential $V_{SHFS}$ lower than shift potential $V_{SHFL}$. The level shifter 161d comprises a resistor $R_5$ disposed between an output node 161a and ground 100a. The shift potential $V_{SHFL}$ is supplied from an end $ND_5$ on the output node 161a side of the resistor $R_5$. The shift potential $V_{SHFS}$ is supplied from an end $ND_6$ on the ground 100a side. The level shifter 161e further comprises a resistor $R_6$ connected between the output node 161a and resistor $R_5$; and a resistor $R_7$ connected between the ground 100a and resistor $R_5$.

Thus, the shift potential $V_{SHFS}$ lower than the shift potential $V_{SHFL}$ can be supplied by utilizing a voltage drop of the resistor $R_5$. Thereby, the detector 161ca can be ahead of the detector 161ba in detecting a decrease in step-up potential $V_{PP}$. Accordingly, as in the first and second preferred embodiments, when an activation signal ACTL is at its low level, the output of the detector 161ba becomes its high level, thereby to reduce a through current passing through the buffer circuit 161bb.

Even when an activation signal ACTL is at its high level, the charge pump 161be is not required to operate by arranging so that the detector 161ca is ahead in detecting a decrease in step-up potential $V_{PP}$, and the charge pump 161cd operates to increase the step-up potential $V_{PP}$. This enables to reduce power consumption by the amount that the charge pump 161be requiring a large power consumption does not operate.

As stated above, the present invention has the effect of reducing power consumption.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a first internal potential generating circuit including:

a first detector for detecting a deviation of an internal potential from a predetermined level, a buffer circuit for receiving an output of said first detector, a control circuit for supplying a clock enable signal which becomes disable regardless of an output of said buffer circuit when an activation signal indicates an inactive state, and is responsive to the output of said buffer circuit when said activation signal indicates an active state, a first oscillator for oscillating a first clock signal in response to said clock enable signal, and a first charge pump for generating said internal potential at an output node, according to said first clock signal; and a second internal potential generating circuit including:

a second detector for detecting a deviation of the internal potential from said predetermined level, said second detector being ahead of said first detector in detecting, a second oscillator for oscillating a second clock signal in response to the output of said second detector, and a second charge pump for generating said internal potential at said output node, according to said second clock signal.

2. The semiconductor device according to claim 1, wherein said second charge pump has a smaller capability of supplying said internal potential than said first charge pump.

3. The semiconductor device according to claim 1, wherein said second internal potential generating circuit further includes:

a buffer circuit for receiving the output of said second detector and supplying a clock enable signal to said second oscillator.

4. The semiconductor device according to claim 1, wherein said second detector detects the deviation of the internal potential from said predetermined level, based on the result of a comparison of a reference potential with a potential related to said internal potential.

5. The semiconductor device according to claim 1 further comprising:

a level shifter for performing level shifting of said internal potential to supply a shift potential, wherein said second detector includes a current mirror circuit, and first and second transistors which are connected to said current mirror circuit, receive at their respective gates said shift potential and a reference potential, and have different current drive capabilities.

6. The semiconductor device according to claim 5, wherein said first and second transistors are of a first conductivity type;

said current mirror circuit includes a third transistor of a second conductivity type having a drain and a gate connected to a drain of said first transistor in common, and a fourth transistor of the second conductivity type having a drain connected to a drain of said second transistor, and having a gate connected to the gate of said third transistor;

said second transistor has a greater channel width than said first transistor; and the output of said second detector is supplied from a node between the drains of said second and fourth transistors.

7. The semiconductor device according to claim 1, wherein said first detector detects the deviation of the internal potential from said predetermined level, based on the result of a comparison of a reference potential with a potential related to said internal potential; and said second detector detects the deviation of the internal potential from said predetermined level, based on the result of a comparison of said reference potential with said potential related to said internal potential.

8. The semiconductor device according to claim 1 further comprising:

a level shifter for performing level shifting of said internal potential to supply a shift potential, wherein said first detector includes a first current mirror circuit, and first and second transistors which are connected to said first current mirror circuit and receive at their respective gates said shift potential and a reference potential;

said second detector includes a second current mirror circuit, and third and forth transistors which are connected to said second current mirror circuit and receive at their respective gates said shift potential and said reference potential; and the ratio of current drive capability of said first transistor to said second transistor is different from the ratio of current drive capability of said third transistor to said fourth transistor.

9. The semiconductor device according to claim 8, wherein said first to fourth transistors are of a first conductivity type;

said first current mirror circuit includes a fifth transistor of a second conductivity type having a drain and a gate connected to a drain of said first transistor in common, and a sixth transistor of the second conductivity type having a drain connected to a drain of said second transistor and having a gate connected to the gate of said fifth transistor;

the output of said first detector is supplied from a node between the drains of said second and sixth transistors;

said second current mirror circuit includes a seventh transistor of the second conductivity type having a drain and a gate connected to a drain of said third transistor, and an eighth transistor of the second conductivity type having a drain connected to a drain of said fourth transistor and having a gate connected to the gate of said seventh transistor;

the output of said second detector is supplied from a node between the drains of said fourth and eighth transistors; and the ratio of channel width of said fourth transistor to said third transistor is larger than the ratio of channel width of said second transistor to said first transistor.

10. The semiconductor device according to claim 1, wherein said first detector detects the deviation of the internal potential from said predetermined level, based on the result of a comparison of a first reference potential with a potential related to said internal potential; and said second detector detects the deviation of the internal potential from said predetermined level, based on the result of a comparison of said potential related to said internal potential with a second reference potential having a different level from said first reference potential.

11. The semiconductor device according to claim 10, further comprising:

a first reference potential generating circuit which includes a first constant current source connected between a power-supply node and a first node for supplying said first reference potential, and a first resistor connected between said first node and ground; and a second reference potential generating circuit which includes a second constant current source connected between said power-supply node and a second node for supplying said second reference potential, and a second resistor connected between said second node and ground, said second resistor having a higher resistance value than said first resistor.

12. The semiconductor device according to claim 1, wherein said first detector detects the deviation of the internal potential from said predetermined level, based on the result of a comparison of a reference potential with a first potential related to said internal potential; and said second detector detects the deviation of the internal potential from said predetermined level, based on the result of a comparison of said reference potential with a second potential that is related to said internal potential and is different from said first potential.

13. The semiconductor device according to claim 1 further comprising:

a level shifter for performing level shifting of said internal potential to supply first and second shift potentials of different levels to said first and second detectors, respectively.

14. The semiconductor device according to claim 13, wherein said level shifter includes a resistor disposed between said output node and ground; and said first and second shift potentials are supplied from a node of the output node side of said resistor and a node of the ground side of said resistor, respectively.

* * * * *